United States Patent [19]
Ishikawa

[11] Patent Number: 5,635,760
[45] Date of Patent: Jun. 3, 1997

[54] SURFACE MOUNT SEMICONDUCTOR DEVICE

[75] Inventor: Toru Ishikawa, Tokyo, Japan

[73] Assignee: NEC Corporation, Japan

[21] Appl. No.: 697,604

[22] Filed: Aug. 27, 1996

Related U.S. Application Data

[63] Continuation of Ser. No. 563,902, Nov. 22, 1995, abandoned, which is a continuation of Ser. No. 268,624, Jun. 30, 1994, abandoned.

[30]   Foreign Application Priority Data

Jul. 1, 1993   [JP]   Japan ..................... 5-163048

[51] Int. Cl.$^6$ .................................. H01L 23/28
[52] U.S. Cl. ................. 257/692; 257/696; 257/723; 257/724; 257/730
[58] Field of Search .................... 257/692–696, 257/730, 723, 724

[56]   References Cited

U.S. PATENT DOCUMENTS 5,309,020   5/1994   Murasawa et al. .............. 257/723

FOREIGN PATENT DOCUMENTS

| | | | |
|---|---|---|---|
| 0513743 | 11/1992 | European Pat. Off. | ......... 257/692 |
| 0216346 | 9/1986 | Japan | ......... 257/730 |
| 1-179442 | 7/1989 | Japan | ......... 257/692 |
| 0087654 | 3/1990 | Japan | ......... 257/730 |
| 0122551 | 5/1990 | Japan | ......... 257/730 |
| 2-49703 | 12/1990 | Japan . | |
| 0105952 | 5/1991 | Japan | ......... 257/730 |
| 0147353 | 6/1991 | Japan | ......... 257/730 |
| 0215964 | 9/1991 | Japan | ......... 257/730 |
| 4079260 | 3/1992 | Japan | ......... 257/723 |
| 4-199555 | 7/1992 | Japan | ......... 257/695 |

*Primary Examiner*—Sara W. Crane
*Assistant Examiner*—David B. Hardy

[57]   ABSTRACT

A semiconductor device of the present invention includes a plurality of lead terminals extending from only one side surface of a package main body having major surfaces and side surfaces, the lead terminal extending parallel to the major surface by a predetermined size and being substantially perpendicularly bent to project from the major surface by a predetermined size in a vertical mount type semiconductor device, or being substantially perpendicularly bent to project from the major surface by a predetermined size and bent again at a distal end portion in parallel to the major surface in a horizontal mount type semiconductor device, and a supporting means projecting from the package main body by substantially the same size as the projecting size of the lead terminals. A method of manufacturing the semiconductor device of the present invention includes the steps of lead frame formation, chip mounting and bonding, mold sealing, and lead terminal formation.

15 Claims, 9 Drawing Sheets

FIG.1A PRIOR ART
FIG.1B PRIOR ART
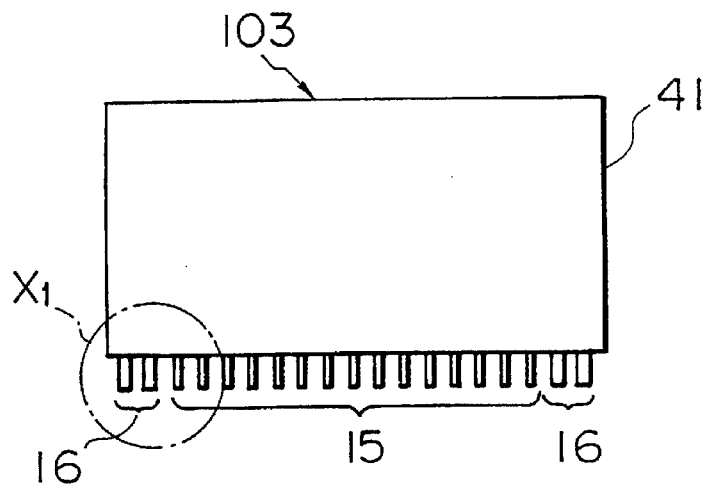
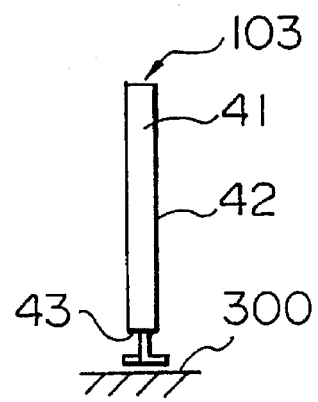
FIG.1C PRIOR ART
FIG.1D PRIOR ART
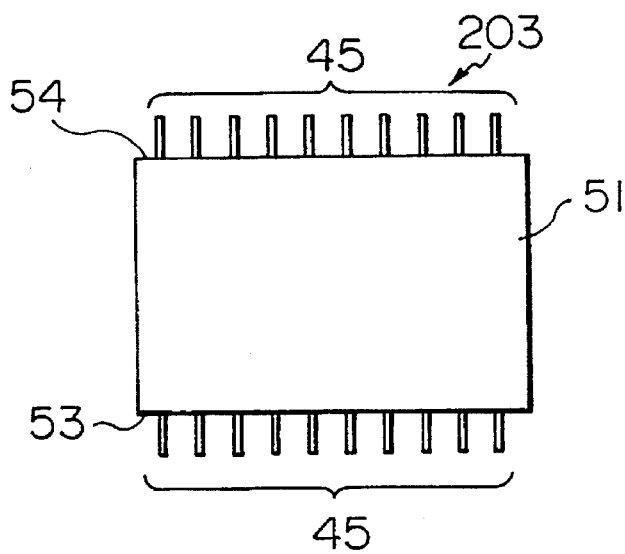
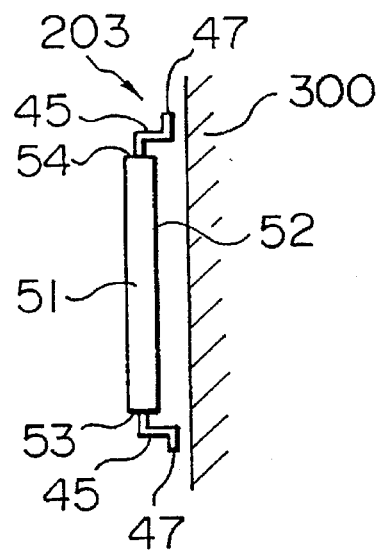
FIG.1E PRIOR ART
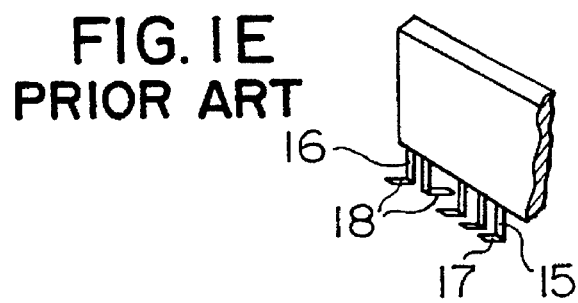

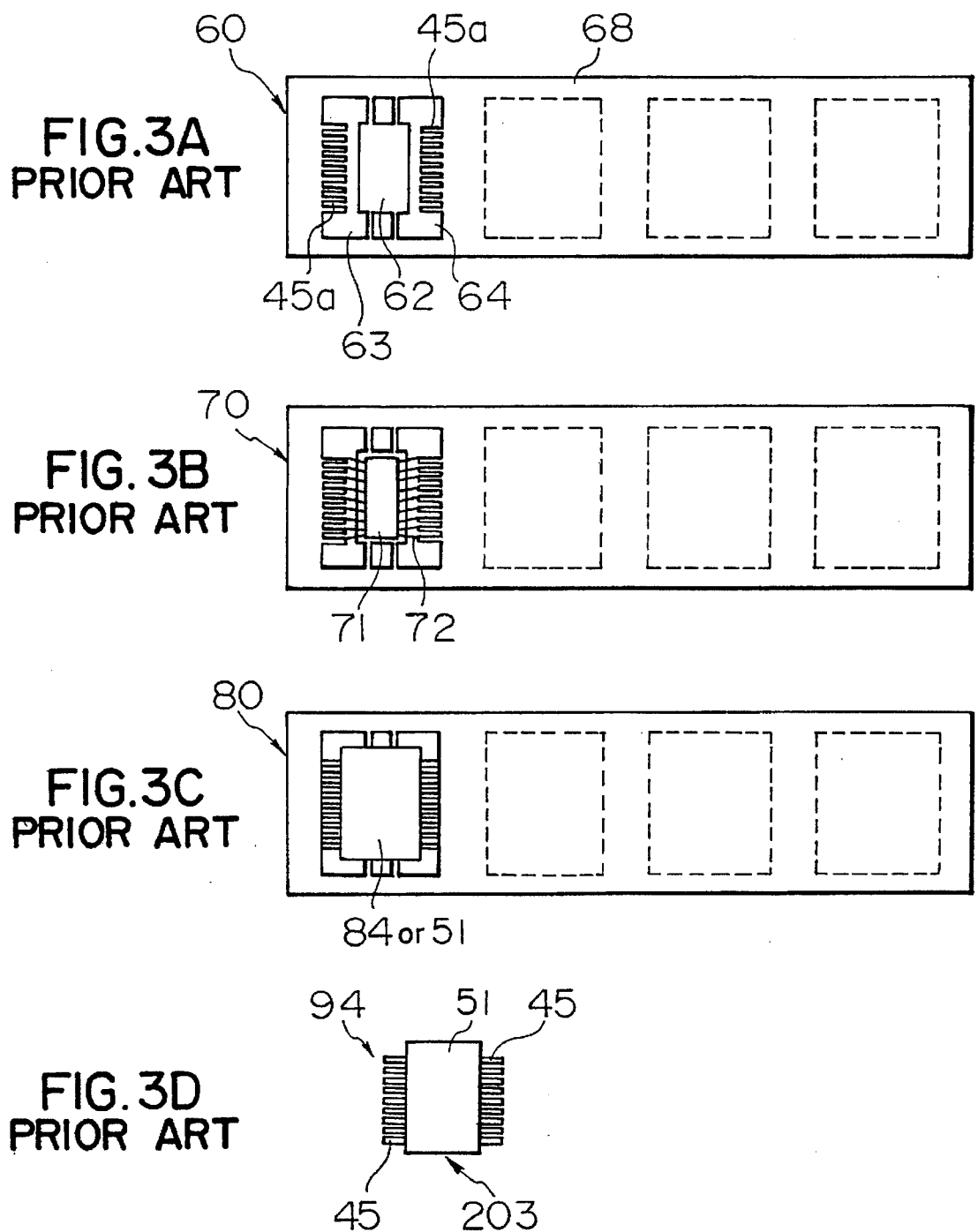

SURFACE MOUNT SEMICONDUCTOR DEVICE

CROSS REFERENCE TO RELATED APPLICATION

This is a continuation of application Ser. No. 08/563,902, filed on Nov. 22, 1995, now abandoned which is a continuation of application Ser. No. 08/268,624, filed on Jun. 30, 1994 now abandoned.

BACKGROUND OF THE INVENTION

1. Field of the Invention

The present invention relates to a semiconductor device and a method of manufacturing the same and, more particularly, to a surface mount type semiconductor device and a method of manufacturing the same.

2. Description of the Prior Arts

In a surface mount type semiconductor device, the distal end of a lead terminal is bent parallel to the surface and electrically connected to a wiring pattern formed on a circuit board surface. As any holes need not be formed in the circuit board to receive the lead terminals for electrical connections in such semiconductor devices, they are widely used in this field.

Currently used standard surface mount type semiconductor devices such as a memory are classified into vertical mount type semiconductor devices called SVPs and vertically mounted on a circuit board surface and horizontal mount type semiconductor device called TSOPs and horizontally (parallelly) mounted on a circuit board surface.

FIGS. 1A and 1B are a front view showing a conventional vertical surface mount type semiconductor device and a side view showing the mount direction on a circuit board, respectively. FIGS. 1C and 1D are a plan view showing a conventional horizontal surface mount type semiconductor device and a side view showing the mount direction on the circuit board, respectively. Note that FIG. 1E is a perspective view of a portion $X_1$ in FIG. 1A.

In a vertical mount type semiconductor device 103 in FIGS. 1A and 1B, a plurality of lead terminals 15 and support leads 16 extend from one long side surface 43 of a package main body 41 in parallel to a major surface 42. Distal ends 17 and 18 of the lead terminals 15 and the support leads 16 are perpendicularly bent, and the semiconductor device 103 is vertically mounted on a circuit board 300. The support leads 16 are members for supporting the semiconductor device 103 and not related to electrical connection. As shown in FIGS. 2A to 2D, in a lead frame forming process 60, a lead frame 67 having a die pad portion 62 supported by suspenders 63, lead terminals 15a, and support leads 16a is formed from a frame 64. In a chip mounting and bonding process 70, a semiconductor chip 71 is fixed on the die pad portion 62, and the electrodes of the semiconductor chip 71 are connected to the corresponding lead terminals 15a by bonding wires 72. In a mold sealing process, sealing with a resin 83 and formation of the package main body 41 are performed. In a lead terminal forming process 93, the lead terminals 15a and the support leads 16a are cut off from the lead frame 67, and the distal ends are bent to form the lead terminals 15 and the support leads 16 having the distal ends 17 and 18, respectively (FIG. 1E).

In a horizontal mount type semiconductor device 203 in FIGS. 1C and 1D, a plurality of lead terminals 45 extend from two long side surfaces 53 and 54 of a package main body 51 in parallel to a major surface 52. Distal end portions 47 of the lead terminals 45 project from the same plane as the major surface 52 and are bent parallel to the major surface, and the semiconductor device 203 is horizontally mounted on the circuit board 300. As shown in FIGS. 3A to 3D, in the lead frame forming process 60, a lead frame 68 having the die pad portion 62 supported by the suspenders 63 and lead terminals 45a provided on both the sides of the die pad portion 62 is formed from the frame 64. In the chip mounting and bonding process 70, the semiconductor chip 71 is fixed on the die pad portion 62, and the electrodes of the semiconductor chip 71 are connected to the corresponding lead terminals 45a by the bonding wires 72. In the mold sealing process, sealing with a resin 84 and formation of the package main body 51 are performed. In a lead terminal forming process 94, the lead terminals 45a are cut off from the lead frame 68, and the distal ends are bent to form the lead terminals 45 having the distal end portions 47 (FIG. 1D).

As described above, the vertical mount type package has a shape entirely different from that of the horizontal mount type package. Accordingly, as shown in FIGS. 2A to 2D and 3A to 3D, different manufacturing processes are performed in these packages.

On the other hand, Japanese Utility Model Publication No. 2-49703 discloses a package in which, as shown in FIGS. 4A to 4D, lead terminals 57 extending from a package main body 56 are perpendicularly bent to reach an adjacent surface, thereby coping with both the vertical and horizontal mount type semiconductor devices.

In the conventional technique in FIGS. 1A to 3D, the lead frame forming, the chip mounting and bonding, the mold sealing, and the lead terminal forming processes are independently performed for the vertical and the horizontal mount type semiconductor devices. For this reason, when both the vertical and the horizontal mount type packages are to be manufactured, the processes are almost doubled as compared to the manufacture of only one type. In addition, since the assembling process is changed, a reliability evaluation for humidity resistance and the like is required for each package.

In the conventional technique in FIGS. 4A to 4D, all the lead terminals have the same shape, so the lead terminals of the standardized SVP (vertical mount type) or TSOP (horizontal mount type) cannot be used. As a result, this method cannot be applied to the conventional package mounting line for the SVPs or TSOPs.

SUMMARY OF THE INVENTION

The present invention has been made in order to solve the above problems in the prior art, and has as its object to provide vertical and horizontal surface mount type semiconductor devices which can be efficiently manufactured, and a method of manufacturing the same.

In order to achieve the above object, according to the first aspect of the present invention, there is provided a horizontal mount type semiconductor device comprising a plurality of lead terminals extending from only one side surface of a package main body having a cubic shape with two major surfaces and four side surfaces, the lead terminal extending from the side surface in parallel to the major surface by a predetermined size, and being substantially perpendicularly bent to project from the side surface by a predetermined size and bent again substantially perpendicularly at a distal end in parallel to the major surface, and supporting means projecting from the package main body by substantially the same size as the projecting size of the lead terminals.

The supporting means may be a projecting portion projecting from the major surface of the package main body. Alternatively, the supporting means can be a plurality of support leads extending from a side surface opposite to the side surface from which the plurality of lead terminals extend. Each support lead extends parallel to the major surface and is bent to project from the same plane as the major surface by the same size as the predetermined size of the lead terminals and bent again to have a distal end parallel to the major surface.

According to the second aspect of the present invention, there is provided a semiconductor device comprising a plurality of lead terminals extending from only one side surface of a package main body having a cubic shape with two major surfaces and four side surfaces, the lead terminal extending from the side surface in parallel to the major surface by a predetermined size and being substantially perpendicularly bent to project from the major surface by a predetermined size, and a projecting portion integrally projecting from the package main body in the same direction by the same size as the lead terminals.

According to the third aspect of the present invention, there is provided a method of manufacturing a semiconductor device comprising the steps of forming a lead frame having a die pad portion, a plurality of lead terminals formed on one side of the die pad portion, and a plurality of support leads formed on the one side of the die pad portion and serving as support means in a vertical mount type semiconductor device, fixing a semiconductor chip on the die pad portion to connect a plurality of electrodes on the semiconductor chip to corresponding first distal end portions of the lead terminals, packaging the die pad portion, the semiconductor chip, the first distal end portions of the lead terminals, and first distal end portions of the support leads on the die pad portion side, thereby obtaining a semi-finished product in which the lead terminals and the support leads extend from only one side surface of a package main body having major surfaces and side surfaces in parallel to the major surface, and projecting portions serving as support means in a horizontal mount type semiconductor device project from the major surface of the package main body, and bending distal ends of the lead terminals and the support leads, all of which extend parallel to the major surface, in a perpendicular direction with respect to the major surface, thereby forming second distal end portions in a vertical mount type semiconductor device, or bending the lead terminals extending parallel to the major surface to project from the major surface by a predetermined size and bending again the lead terminals parallel to the major surface, thereby forming the second distal end portions in a horizontal mount type semiconductor device, on the basis of a decision whether the vertical or horizontal mount type semiconductor device is to be completed.

In a horizontal mount type semiconductor device, the support leads can be cut off at proximal portions extending from the side surface of the package main body.

According to the fourth aspect of the present invention, there is provided a method of manufacturing a semiconductor device comprising the steps of forming a lead frame having a die pad portion, a plurality of lead terminals formed on a first side of the die pad portion and a plurality of first support leads serving as supporting means in a vertical mount type semiconductor device, and a plurality of second support leads formed on a second side opposite to the first side of the die pad portion and serving as supporting means in a horizontal mount type semiconductor device, fixing a semiconductor chip on the die pad portion to connect a plurality of electrodes on the semiconductor chip to corresponding first distal end portions of the lead terminals, packaging the die pad portion, the semiconductor chip, the first distal end portions of the lead terminals, and first distal end portions of the first and second support leads on the die pad portion side, thereby obtaining a semifinished product in which the lead terminals and the first support leads extend from only a first side surface of a package main body having major surfaces and side surfaces in parallel to the major surface, and the second support leads extend from a second side surface opposite to the first side surface of the package main body in parallel to the major surface, and bending distal ends of the lead terminals and the first support leads, all of which extend parallel to the major surface, in a direction perpendicular to the major surface, thereby forming second distal end portions in a vertical mount type semiconductor device, or bending the lead terminals and the second support leads, all of which extend parallel to the major surface, to project from the major surface by a predetermined size and bending again the distal ends parallel to the major surface, thereby forming the second distal end portions in a horizontal mount type semiconductor device, on the basis of a decision whether the vertical or horizontal mount type semiconductor device is to be completed.

In a horizontal mount type semiconductor device, the first support leads can be cut off at proximal portions extending from the first side surface of the package main body.

The horizontal and vertical mount type semiconductor devices provided by the present invention can use the same lead frame forming, chip mounting, bonding, and sealing processes. Only the lead terminal forming process is changed depending on the type of semiconductor device.

Therefore, the semiconductor device of the present invention can be effectively manufactured as compared to the conventional device in which all the processes must be changed depending on the type of semiconductor device.

In addition, according to the present invention, except for the lead terminal forming process, the same processes can be used for both the types. An evaluation for humidity resistance and the like is sufficiently performed for the package of one type, so that the process and labor for evaluation can be halved.

Furthermore, according to the present invention, the same lead terminals as those used in the conventional horizontal and vertical mount type packages can be formed in the lead terminal forming process. For this reason, this method can be applied to the mounting line used for the conventional packages such as SVPs and TSOPs, The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIGS. 1A to 1E are views related to conventional surface mount type semiconductor devices, in which FIG. 1A is a front view showing a vertical mount type semiconductor device, FIG. 1B is a side view showing the mount direction of the vertical mount type semiconductor device on a circuit board, FIG. 1C is a plan view showing a horizontal mount type semiconductor device, and FIG. 1D is a side view showing the mount direction of the horizontal mount type semiconductor device on the circuit board, and FIG. 1E is a perspective view of a portion $X_1$ in FIG. 1A;

FIGS. 3A to 3D are process charts showing steps in the manufacture of the conventional horizontal mount type semiconductor device;

FIGS. 4A to 4D are views related to other conventional surface mount type semiconductor devices, in which FIG. 4A is a front view showing a vertical mount type semiconductor device, FIG. 4B is a side view showing the mount direction of the vertical mount type semiconductor device on the circuit board, FIG. 4C is a plan view showing a horizontal mount type semiconductor device, and FIG. 4D is a side view showing the mount direction of the horizontal mount type semiconductor device on the circuit board;

FIGS. 5A to 5E are views related to surface mount type semiconductor devices according to the first embodiment of the present invention, in which FIG. 5A is a front view showing a vertical mount type semiconductor device, FIG. 5B is a side view showing the mount direction of the vertical mount type semiconductor device on a circuit board, FIG. 5C is a plan view showing a horizontal mount type semiconductor device, FIG. 5D is a side view showing the mount direction of the horizontal mount type semiconductor device on the circuit board, and FIG. 5E is a perspective view of a portion $X_5$ in FIG. 5A;

FIGS. 7A to 7E are views related to surface mount type semiconductor devices according to the second embodiment of the present invention, in which FIG. 7A is a front view showing a vertical mount type semiconductor device, FIG. 7B is a side view showing the mount direction of the vertical mount type semiconductor device on a circuit board, FIG. 7C is a plan view showing a horizontal mount type semiconductor device, FIG. 7D is a side view showing the mount direction of the horizontal mount type semiconductor device on the circuit board, and FIG. 7E is a perspective view of a portion $X_7$ in FIG. 7A;

DETAILED DESCRIPTION OF THE PREFERRED EMBODIMENTS

Preferred embodiments of the present invention will be described below with reference to the accompanying drawings (FIGS. 5A to 10B).

Figure 2A:
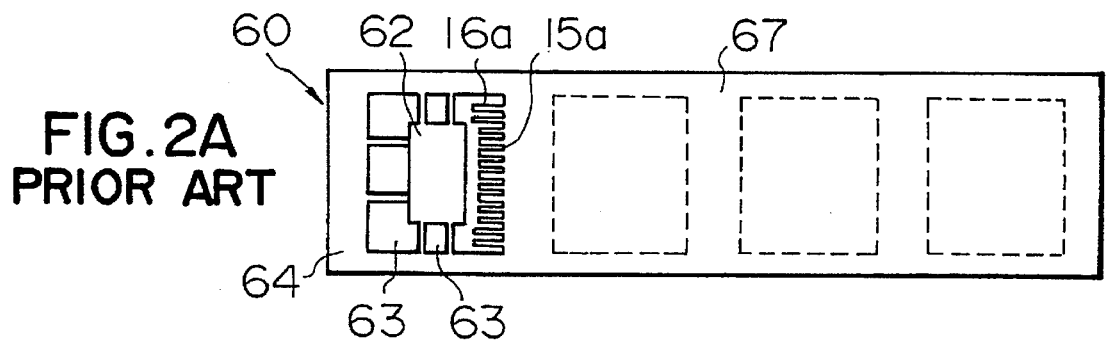
FIGS. 2A to 2D are process charts showing steps in the manufacture of the conventional vertical mount type semiconductor device.
Figure 2B:
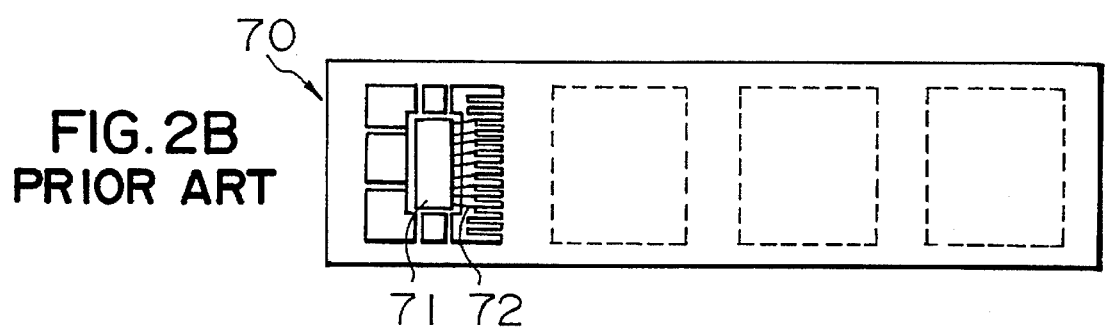
Figure 2C:
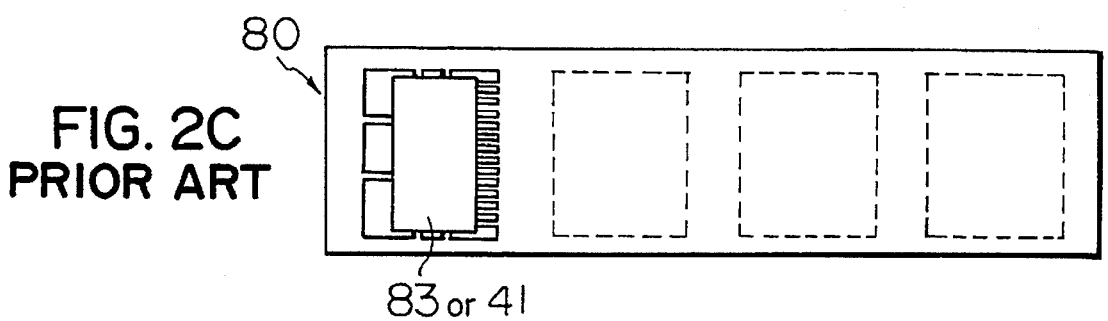
Figure 2D:
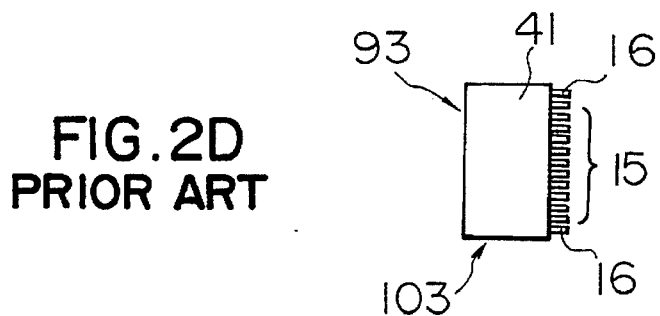
Figure 4A:
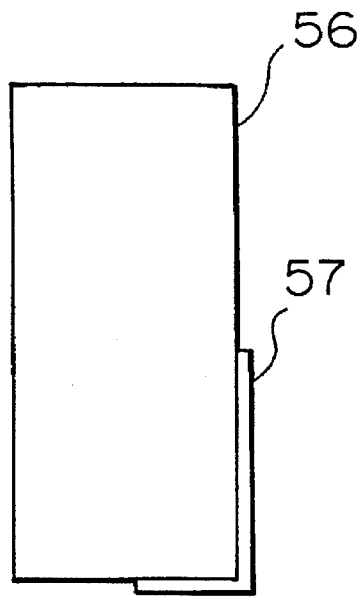
Figure 4B:
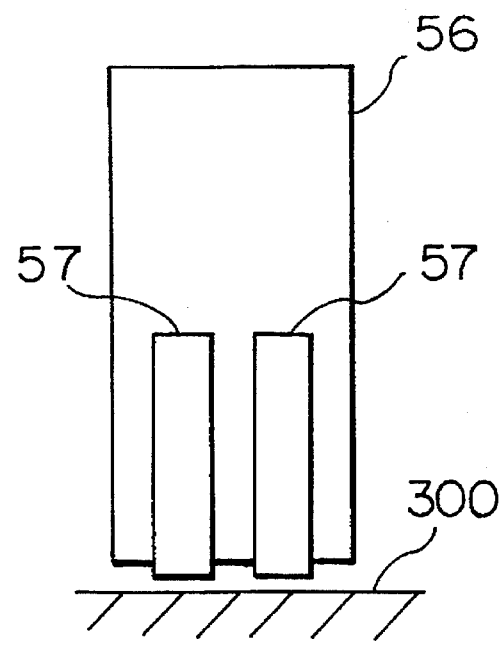
Figure 4C:
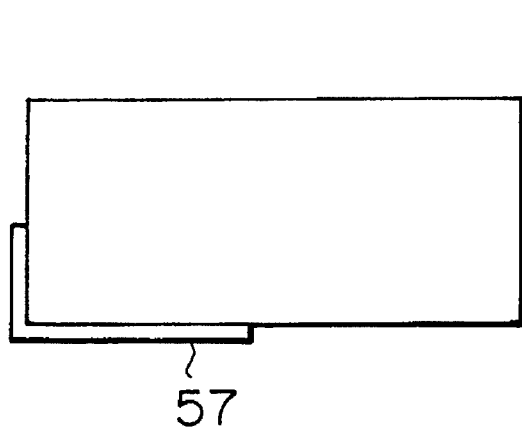
Figure 4D:
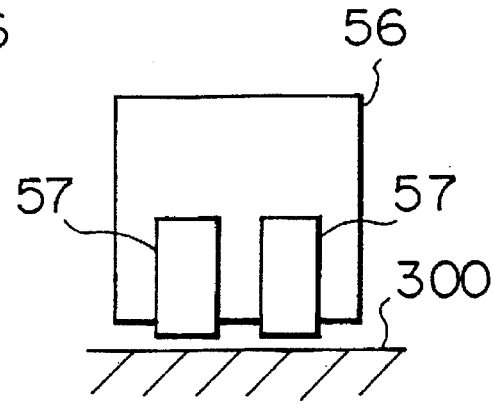
Figure 5A:
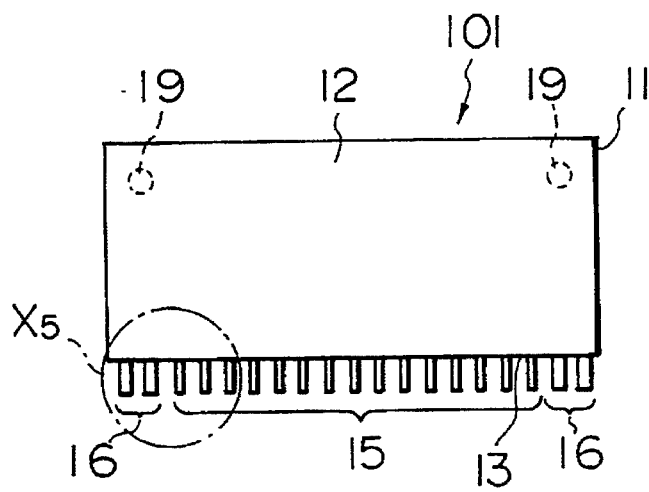
Figure 5B:
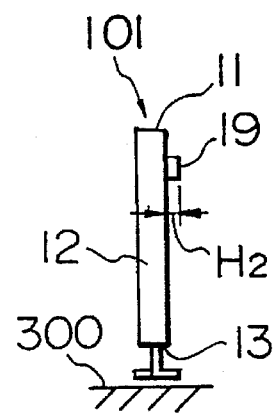
Figure 5C:
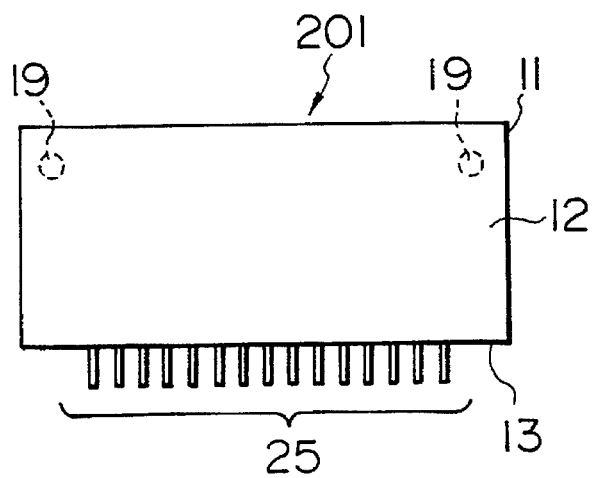
Figure 5D:
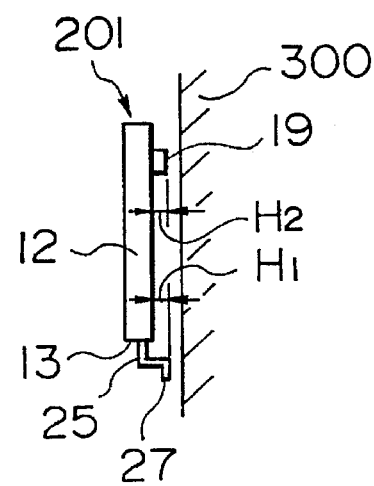
Figure 5E:
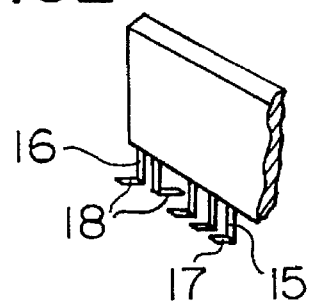

FIGS. 5A to 5E are views showing the first embodiment of the present invention. FIGS. 5A and 5B are a front view showing a vertical surface mount type semiconductor device according to the first embodiment and a side view showing the mount direction on a circuit board, respectively. FIGS. 5C and 5D are a plan view showing a horizontal surface mount type semiconductor device according to the first embodiment and a side view showing the mount direction on the circuit board, respectively. Note that FIG. 5E is a perspective view of a portion $X_5$ in FIG. 5A.

In a vertical mount type semiconductor device 101 in FIGS. 5A and 5B, a package main body 11 has two major surfaces and four side surfaces and is formed of a molding resin in a rectangular parallelepiped having a long side of 25 mm, a short side of 12 mm, and a thickness of 1.2 mm. A plurality of lead terminals 15 and support leads 16 extend from one long side surface 13 by 1.0 mm in parallel to one major surface 12. The distal ends of the lead terminals 15 and the support leads 16 are perpendicularly bent to form distal end portions 17 and 18 having a length of 1.8 mm. The distal end portions 17 of the lead terminals 15 are fixed on a wiring layer (not shown) formed on the surface of a circuit board 300 such as a print board, thereby electrically connecting a semiconductor chip in the package main body 11 to the wiring layer. The distal end portions 18 of the support leads 16 are fixed on the wiring layer formed on the surface of the circuit board 300 or a conductive layer which is not related to an electrical circuit, thereby supporting the vertically mounted semiconductor device 101. The support leads 16 are not electrically connected to the semiconductor chip in the package main body 11. For this reason, there are no electrical connections between the semiconductor chip and the wiring layer or conductive layer of the circuit board, on which the distal end portions 18 of the support leads 16 are fixed. Two projecting portions 19 project from the major surface of the package main body 11 to a height $H_2$ of 0.5 to 1.0 mm. This projection size is equal to an interval between the circuit board and the package when it is horizontally mounted.

In a horizontal mount type semiconductor device 201 in FIGS. 5C and 5D, the package main body 11 and the projecting portions 19 have the same shapes as those in the vertical mount type semiconductor device 101. A plurality of lead terminals 25 of the horizontal mount type semiconductor device 201 extend from the side surface 13 in parallel to the major surface 12. The lead terminals 25 are then bent to project from the same plane as the major surface 12 by a predetermined size $H_1$ of 0.5 to 1.0 mm, and bent again parallel to the major surface 12 to form distal end portions 27. The height $H_1$ of the lead terminal 25 projecting from the same plane as the major surface 12 is equal to the height $H_2$ of the projecting portion 19 from the major surface 12. In the horizontal mount type semiconductor device 201 in FIGS. 5C and 5D, the support leads 16 shown in FIGS. 5A and 5B are cut off at the proximal portions on the side surface 13 of the package main body 11. The distal end portions 27 of the lead terminals 25 are fixed on the wiring layer formed on the surface of the circuit board 300 such as a print board, thereby electrically connecting the semiconductor chip in the package main body 11 to the wiring layer. The projecting portions 19 integrally formed with the package main body 11 of the molding resin are in contact with the surface of the circuit board 300 to support the horizontally mounted semiconductor device 201.

A method of manufacturing the vertical and horizontal mount type semiconductor devices 101 and 201 according to the first embodiment will be described below with reference to FIGS. 6A to 6D.

Figure 6A:
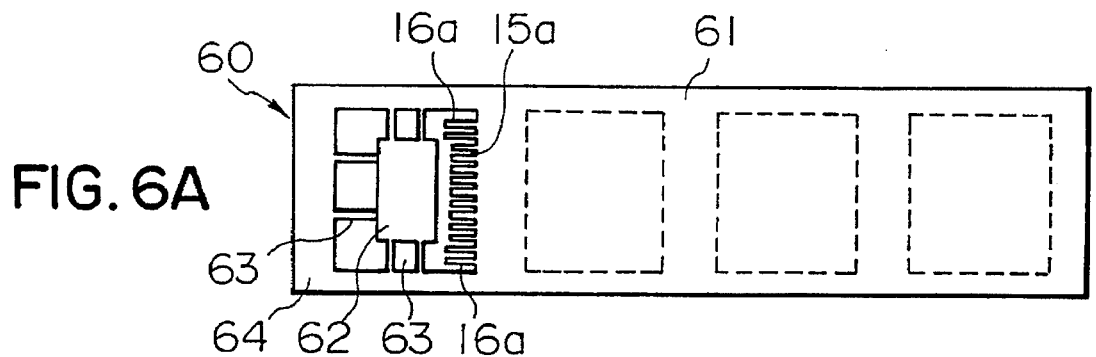
FIGS. 6A to 6D are process charts showing steps in the manufacture of the semiconductor devices according to the first embodiment of the present invention.
Figure 6B:
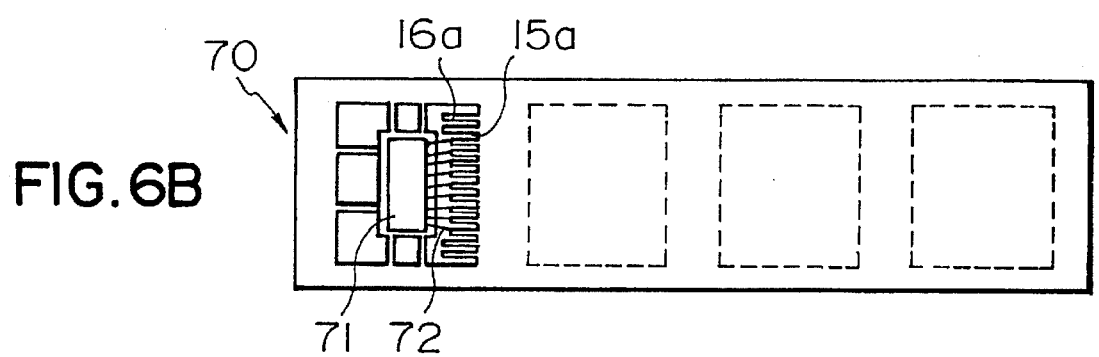
Figure 6C:
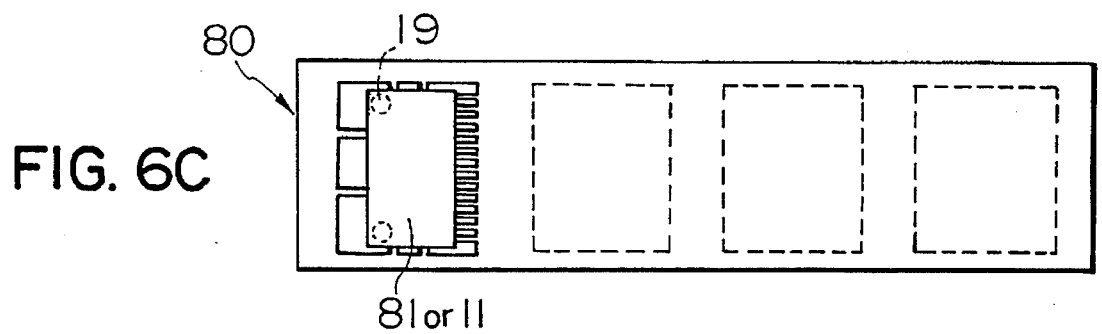

In a lead frame forming process 60, a lead frame 61 having a die pad portion 62 supported by suspenders 63, and lead terminals 15a and support leads 16a, all of which are provided on one side of the die pad portion 62, is formed from a frame 64 (FIG. 6A). In a chip mounting and bonding process 70, a semiconductor chip 71 is fixed on the die pad portion 62, and the electrodes (none are shown) of the semiconductor chip 71 are electrically connected to the corresponding lead terminals 15a by bonding wires 72 (FIG. 6B). In a mold sealing process as a packaging sealing process, sealing with a resin 81 and formation of the package main body 11 including the projecting portion 19 are performed (FIG. 6C). If hermetic sealing is performed in place of mold sealing, the package main body 11 is formed of a ceramic.

Figure 6D:
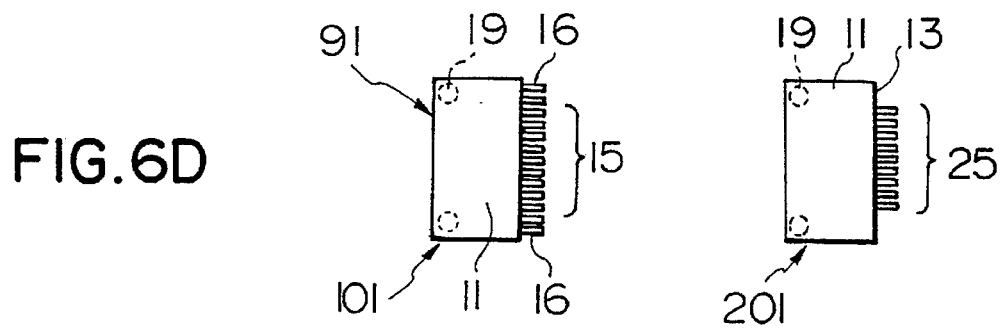

A lead terminal forming process 91 is divided into two processes on the basis of a decision whether the semiconductor device is to be completed as a vertical mount type or horizontal mount type semiconductor device (FIG. 6D).

For the vertical mount type semiconductor device, the lead terminals 15a and the support leads 16a are cut off from the lead frame 61. The distal ends are bent to form the lead terminals 15 and the support leads 16 having the distal end portions 17 and 18 (FIG. 5A and 5B), respectively, thereby completing the vertical mount type semiconductor device 101.

For the horizontal mount type semiconductor device, the lead terminals 15a are cut off from the lead frame 61, and the support leads 16a are cut off at the proximal portions on the side surface 13 of the package main body 11 and separated from the lead frame 61. The distal ends of the extending lead terminals 15a are bent to form the lead terminals 25 having the distal end portions 27 (FIGS. 5C and 5D), thereby completing the horizontal mount type semiconductor device 201.

Figure 7A:
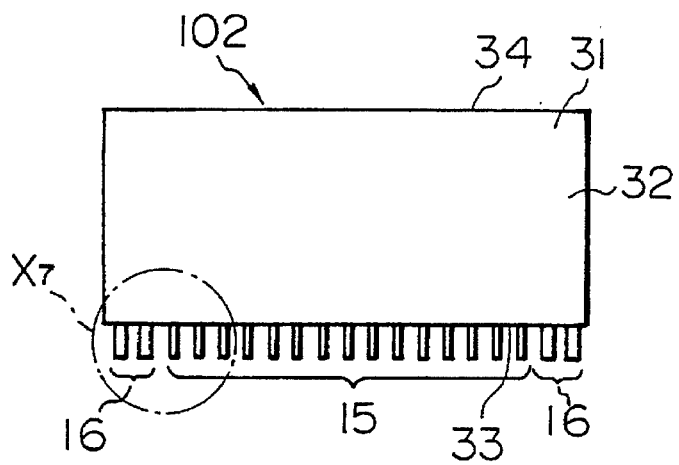
Figure 7B:
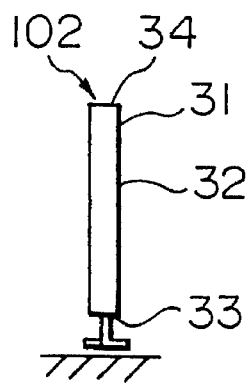
Figure 7C:
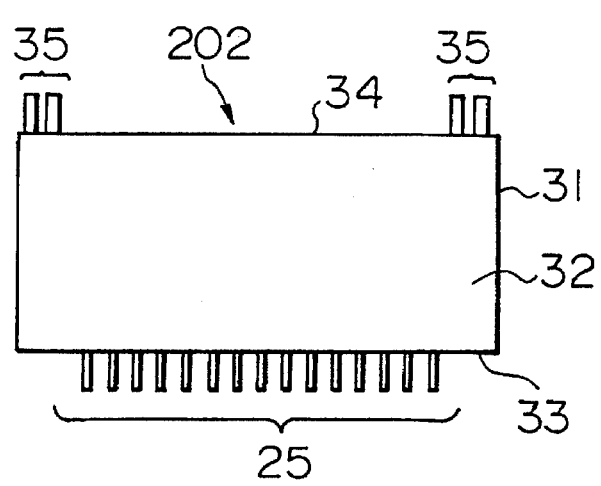
Figure 7D:
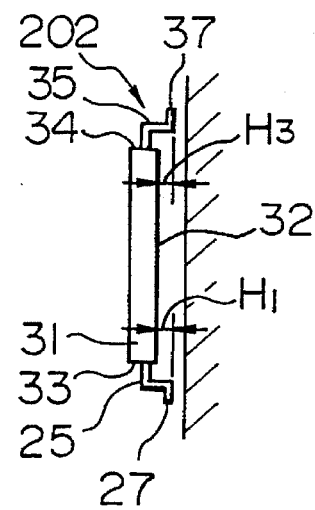
Figure 7E:
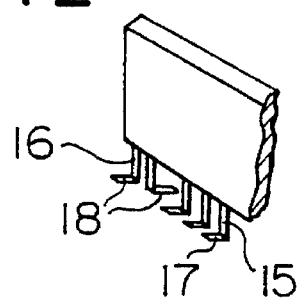
Figure 8A:
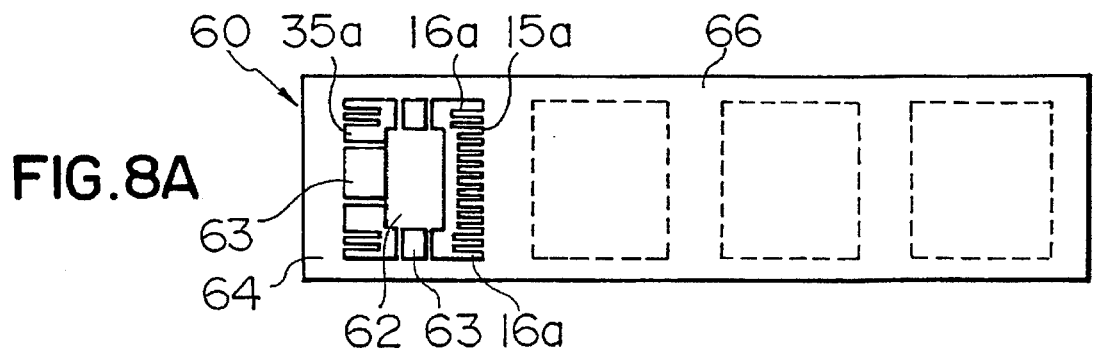
FIGS. 8A to 8D are process charts showing steps in the manufacture of the semiconductor devices according to the second embodiment of the present invention.
Figure 8B:
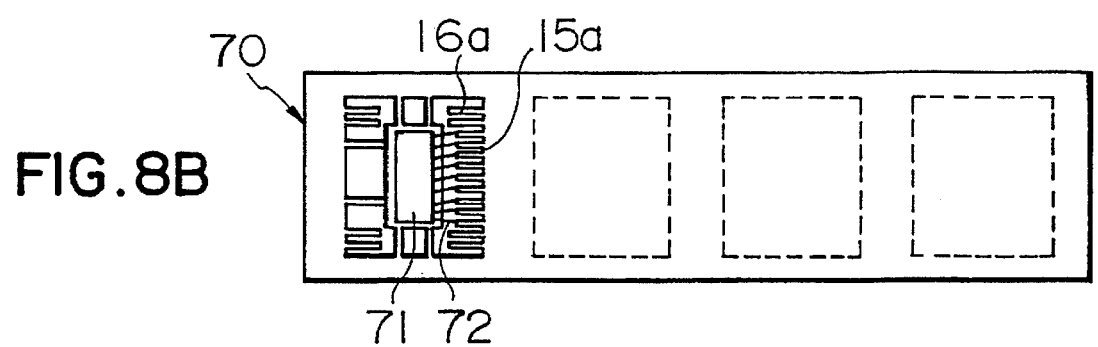
Figure 8C:
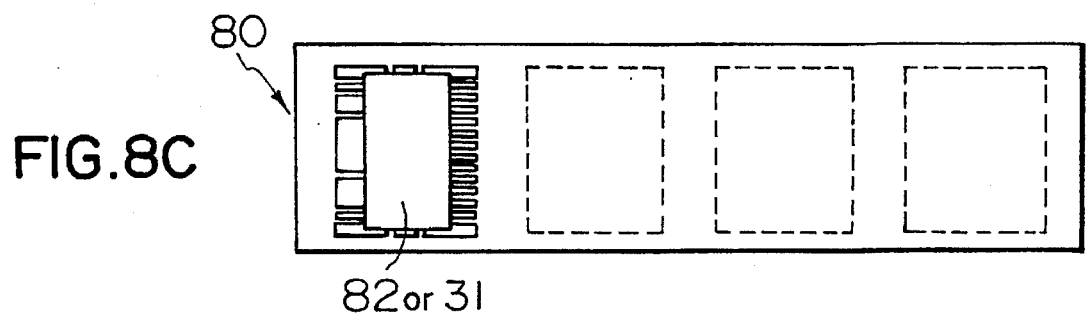
Figure 8D:
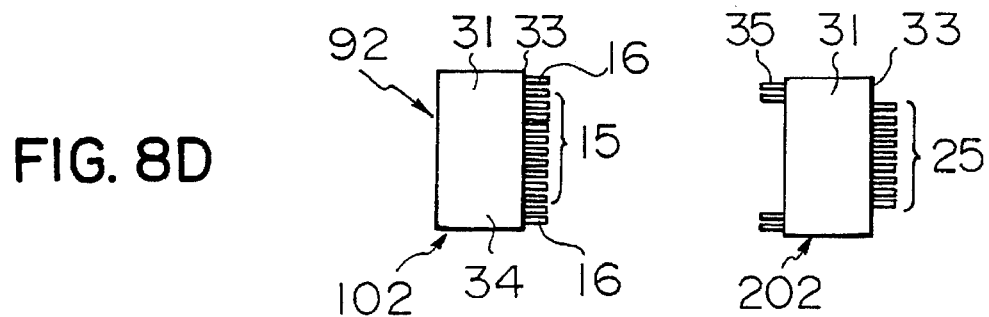

FIGS. 7A to 7E are views related to the second embodiment of the present invention, in which FIGS. 7A and 7B are a front view showing a vertical surface mount type semiconductor device according to the second embodiment and a side view showing the mount direction on a circuit board, respectively, and FIG. 7C and 7D are a plan view showing a horizontal surface mount type semiconductor device according to the second embodiment and a side view showing the mount direction on the circuit board, respectively. Note that FIG. 7E is a perspective view of a portion $X_7$ in FIG. 7A.

In a vertical mount type semiconductor device 102 shown in FIGS. 7A and 7B, a package main body 31 formed of a molding resin in a rectangular parallelepiped has a first long side surface 33, a second long side surface 34, and a major surface 32. A plurality of lead terminals 15 and first support leads 16 extend from the first long side surface 33 in parallel to the major surface 32. The distal ends of the lead terminals and the first support leads are perpendicularly bent to form distal end portions 17 and 18, respectively.

In a horizontal mount type semiconductor device 202 shown in FIGS. 7C and 7D, the package main body 31 has the same shape as that in the vertical mount type semiconductor device 201. A plurality of lead terminals 25 of the horizontal mount type semiconductor device extend from the first long side surface 33 in parallel to the major surface 32. The lead terminals 25 are then bent to project by a predetermined size from the same plane as the major surface 32, and bent again parallel to the major surface 32 to form distal end portions 27. The distal end portions 27 are fixed and connected to a wiring layer of a circuit board 300. In FIGS. 7C and 7D, the first support leads 16 shown in FIGS. 7A and 7B are cut off at the proximal portions on the first long side surface 33 of the package main body 31 and removed. However, in the horizontal mount type semiconductor device 202 in FIGS. 7C and 7D, second support leads 35 extend from the two end portions of the second long side surface 34 of the package main body 31. The second support leads 35 extend from the second long side surface 34 in parallel to the major surface 32. The second support leads 35 are then bent to project from the same plane as the major surface by the same size $H_3$ as a projecting amount $H_1$ of the lead terminals 25, and bent again parallel to the major surface 32 to form distal end portions 37. Like the first support leads 16, the second support leads 35 are also not connected to the semiconductor chip in the package main body 31. Therefore, there are no electrical connections between the semiconductor chip and the wiring layer or conductive layer of the circuit board, on which the distal end portions 37 of the second support leads 35 are fixed.

A method of manufacturing the vertical and horizontal mount type semiconductor devices 102 and 202 according to the second embodiment will be described below with reference to FIGS. 8A to 8D.

In a lead frame forming process 60, a lead frame 66 having a die pad portion 62 supported by suspenders 63, lead terminals 15a and first support leads 16a, all of which are provided on one side of the die pad portion 62, and second support leads 35a provided on the other side of the die pad portion 62 is formed from a frame 64. In a chip mounting and bonding process 70, a semiconductor chip 71 is fixed on the die pad portion 62, and the electrodes of the semiconductor chip 71 are connected to the corresponding lead terminals 15a by bonding wires 72. In a mold sealing process, sealing with a resin 82 and formation of the package main body 31 are performed. If hermetic sealing is performed in place of mold sealing, the package main body 31 is formed of a ceramic.

A lead terminal forming process 92 is divided into two processes on the basis of decision to determine whether a vertical or horizontal mount type semiconductor device is to be completed.

In the vertical mount type semiconductor device, the second support leads 35a are cut off at the proximal portions on the second long side surface 34 of the package main body 31. The lead terminals 15a and the first support leads 16a are cut off from the lead frame 66. The distal ends of the lead terminals 15 and the first support leads 16a are bent to form the lead terminals 15 and the first support leads 16 having the distal end portions 17 and 18 (FIGS. 7A and 7B), respectively, thereby completing the vertical mount type semiconductor device 101.

In the horizontal mount type semiconductor device, the first support leads 16a are cut off at the proximal portions on the first long side surface 33 of the package main body 31 and removed. The lead terminals 15a and the second support leads 35a are cut off from the lead frame 66. The distal ends of the lead terminals 15a and the second support leads 35a are bent to form the lead terminals 25 and the second support leads 35 having the distal end portions 27 and 37 (FIGS. 7C and 7D), respectively, thereby completing the horizontal mount type semiconductor device 202.

Figure 9A:
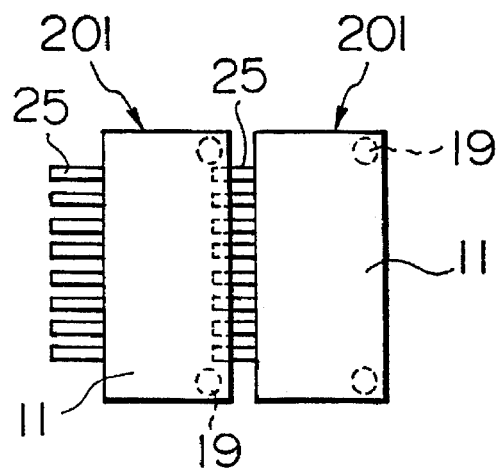
FIGS. 9A and 9B are plan and side views each showing a state in which a plurality of horizontal mount type semiconductor devices according to the first embodiment of the present invention are mounted on a circuit board.
Figure 9B:
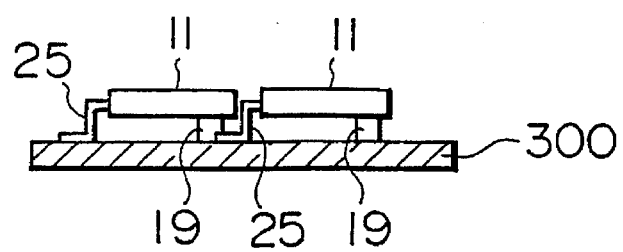

FIGS. 9A and 9B are views showing an example in which a plurality of horizontal mount type semiconductor devices 201 (only two of them are shown) according to the first embodiment are mounted on the circuit board 300. As shown in FIGS. 9A and 9B, a plurality of lead terminals of one semiconductor device 201 are inserted under the other semiconductor device 201 into a portion having no projecting portion 19, thereby realizing high-density mounting.

Figure 10A:
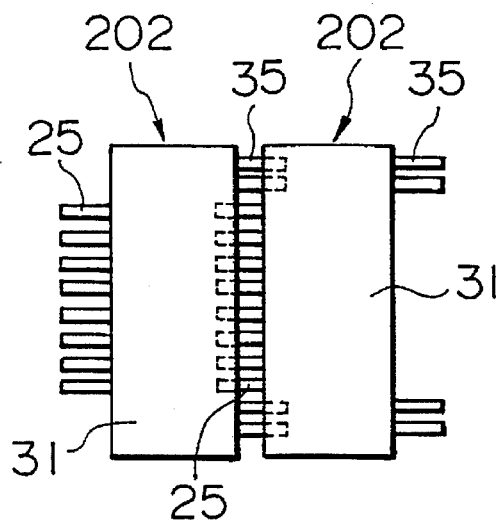
FIGS. 10A and 10B are plan and side views each showing a state in which a plurality of horizontal mount type semiconductor devices according to the second embodiment of the present invention are mounted on a circuit board.
Figure 10B:
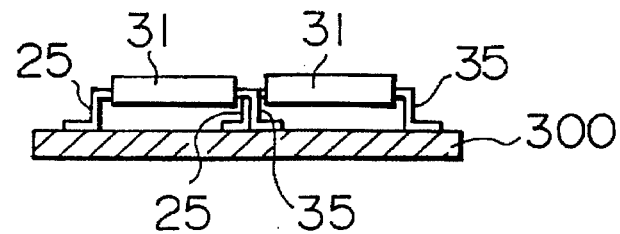

FIGS. 10A and 10B are views showing an example in which a plurality of horizontal mount type semiconductor devices 202 (only two of them are shown) according to the second embodiment are mounted on the circuit board 300.

As shown in FIGS. 10A and 10B, a plurality of lead terminals 25 of one semiconductor device 202 are inserted between the second support leads 35 of the other semiconductor device 202, thereby realizing high-density mounting.

What I claim is:

1. A horizontal mount type semiconductor device comprising:

a package main body having two opposed and parallel major surfaces, and four side Surfaces connected to said two major surfaces;

a plurality of lead terminals extending from only one of said side surfaces, each of said plurality of lead terminals having a first leg as it extends from said one side surface with said first leg being substantially parallel to said major surfaces, a second leg being bent substantially perpendicularly to said first leg, and a third leg being bent substantially perpendicularly to said second leg and extending by a predetermined perpendicular distance from the plane of one of said major surfaces; and a support means projecting from and extending from the plane of said one major surface by the same predetermined perpendicular distance as said third leg of each of said plurality of lead terminals.

2. A device according to claim 1, wherein said supporting means is a projecting portion integrally projecting from one of said major surfaces of said package main body by said predetermined perpendicular distance, and said projecting portion extends from said one major surface in the same direction as said plurality of lead terminals extend from the plane of said one major surface.

3. A device according to claim 2, wherein at least two of said semiconductor device are mounted on a circuit board adjacent to each other such that said plurality of lead terminals of one of said semiconductor devices are attached to a portion of said circuit board adjacent to said other semiconductor device and unoccupied by lead terminals and projecting portion of said other semiconductor device.

4. A device according to claim 1, wherein said supporting means is a plurality of support leads extending from a side surface opposite to said side surface from which said plurality of lead terminals extend, said plurality of support leads having a first, second and third leg substantially the same as the first, second and third leg of said plurality of lead terminals.

5. A device according to claim 4, wherein said plurality of lead terminals extend from a central portion of said side surface, and said plurality of support leads extend from two end portions of said opposite side surface, thereby said semiconductor device is adapted to be mounted on a circuit board adjacent another said semiconductor device such that said plurality of lead terminals of said semiconductor device are mounted on said circuit board between support leads of said other semiconductor device.

6. A device according to claim 1, wherein said package main body is formed of a molding resin.

7. A vertical mount type semiconductor device comprising:

a package main body having two opposed and parallel major surfaces, and four side surfaces connected to said two major surfaces;

a plurality of lead terminals extending from only one of said side surfaces of said package main body, each of said plurality of lead terminals having a first leg as it extends from said one side surface with said first leg being substantially parallel to said major surfaces, each of said plurality of lead terminals having a second leg being bent substantially perpendicular to said first leg, said second leg having a distal end, said distal end of said second leg extending a predetermined perpendicular distance from the plane of one of said major surfaces; and a projecting portion integral to said package main body and extending from said main body a distance being the same as the predetermined perpendicular distance said distal end of said second leg extends from said plane of said one major surface, and said projecting portion extends from said package main body in the same direction as the second leg extends from said first leg.

8. A device according to claim 7, wherein said package main body is formed of a molding resin.

9. A horizontal mount type semiconductor device comprising:

a package main body having two opposed and parallel major surfaces and four side surfaces respectively connected said major surfaces;

a first side surface of said four side surfaces which includes a first section having a predetermined distance from one end of the first side surface, a second section having a predetermined distance from another end of the first side surface, and a third section interposed between the first and the second sections, with no lead terminal extending from the first and the second sections;

a plurality of lead terminals extending from only the third section of said first side surface; and first and second projecting portions, each of said projecting portions being integrally formed on a first major surface of said major surfaces in the vicinity of a corner of said first major surface adjacent a second side surface from which no lead terminal extends, said second side surface being opposite said first side surface, and a distance between said first and second projecting portions being longer than the length of said third section of said first side surface.

10. A device according to claim 9, wherein said plurality of lead terminals has a first leg extending substantially parallel to said major surfaces from said first side surface, a second leg being bent substantially perpendicular to said first leg, and a third leg being bent substantially perpendicular to said second leg and extending a predetermined perpendicular distance from the plane of said fist major surface on which said projecting portions are formed.

11. A device according to claim 10, wherein each of said projecting portions extends from the plane of the first major surface by the same predetermined perpendicular distance as said third leg of each of said plurality of lead terminals.

12. A horizontal mount type semiconductor device comprising:

a package main body having two opposed and parallel major surfaces and four side surfaces respectively connected to said major surfaces;

a first side surface of said four side surfaces including a first section having a predetermined distance from one end of the first side surface, a second section having a predetermined distance from another end of the first side surface, and a third section interposed between the first and the second sections, with no lead terminal extending from the first and the second sections;

a plurality of lead terminals extending from only the third section of said first side surface;

a second side surface of said four side surfaces opposite to said first side surface and including a fourth section having a predetermined distance from one end of the second side surface, a fifth section having a predetermined distance from another end of the second side surface, and a sixth section interposed between the fourth and the fifth sections and having a longer length than the length of the third section, with no lead terminal extending from the sixth section; and a plurality of first and second support leads extending from the fourth and the fifth sections, respectively, of said second side surface.

13. A device according to claim 12, wherein each of said plurality of lead terminals has a first leg extending substantially parallel to said major surfaces from said first side surface in an opposite direction to said second side surface on which said first and second support leads are formed, a second leg being bent substantially perpendicular to said first leg, and a third leg being bent substantially perpendicular to said second leg and extending a predetermined perpendicular distance from the plane of said first major surface.

14. A device according to claim 13, wherein each of said plurality of first and second support leads has a first leg extending substantially parallel to said major surfaces from said second side surface in an opposite direction to said first side surface, a second leg being bent substantially perpendicular to said first leg and extending in the same direction as said second leg of each of said lead terminals, and a third leg being bent substantially perpendicular to said second leg and extending by the same predetermined perpendicular distance as said third leg of each of said plurality of lead terminals.

15. A circuit board having mounted thereon a plurality of horizontal mount type semiconductor devices, the semiconductor devices comprising:

a package main body having two opposed and parallel major surfaces and four side surfaces respectively connected to said major surfaces;

a first side surface of said four side surfaces including a first section having a predetermined distance from one end of the first side surface, a second section having a predetermined distance from another end of the first side surface, and a third section interposed between the first and the second sections, with no lead terminal extending from the first and the second sections;

a plurality of lead terminals extending from only the third section of said first side surface;

a second side surface of said four side surfaces opposite to said first side surface and including a fourth section having a predetermined distance from one end of the second side surface, a fifth section having a predetermined distance from another end of the second side surface, and a sixth section interposed between the fourth and the fifth sections and having a longer length than the length of the third section, with no lead terminal extending from the sixth section; and a plurality of first and second support leads extending from the fourth and the fifth sections, respectively, of said second side surface;

the plurality of semiconductor devices adjacent each other on the circuit board with the lead terminals of the third section contacting the circuit board and the first and second support leads of the fourth and fifth sections contacting the circuit board to provide support.

* * * * *